US 9,196,462 B2

(12) United States Patent
Carducci et al.

(10) Patent No.: US 9,196,462 B2
(45) Date of Patent: Nov. 24, 2015

(54) SHOWERHEAD INSULATOR AND ETCH CHAMBER LINER (71) Applicant: Applied Materials, Inc., Santa Clara, CA (US)

(72) Inventors: James D. Carducci, Sunnyvale, CA (US); Olga Regelman, Daly City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 571 days.

(21) Appl. No.: 13/649,913

(22) Filed: Oct. 11, 2012

(65) Prior Publication Data

US 2013/0327480 A1 Dec. 12, 2013

Related U.S. Application Data

(63) Continuation of application No. 12/345,821, filed on Dec. 30, 2008, now abandoned.

(60) Provisional application No. 61/020,229, filed on Jan. 10, 2008.

(51) Int. Cl.
*H01J 37/32* (2006.01)

(52) U.S. Cl.
CPC ....... *H01J 37/32633* (2013.01); *H01J 37/3244* (2013.01); *H01J 37/32449* (2013.01); *H01J 37/32477* (2013.01)

(58) Field of Classification Search
CPC combination set(s) only.
See application file for complete search history.

(56) References Cited

U.S. PATENT DOCUMENTS

| 6,063,441 | A | 5/2000 | Koai et al. |
|---|---|---|---|
| 6,106,625 | A | 8/2000 | Koai et al. |
| 6,140,215 | A | 10/2000 | Foster et al. |
| 6,364,949 | B1 | 4/2002 | Or et al. |
| 6,403,491 | B1 | 6/2002 | Liu et al. |

(Continued)

FOREIGN PATENT DOCUMENTS

JP 2004-285479 10/2004

OTHER PUBLICATIONS

Search report and written opinion dated Apr. 28, 2009 for PCT/US2009/030266.

*Primary Examiner* — Keath Chen
*Assistant Examiner* — Aiden Lee
(74) *Attorney, Agent, or Firm* — Patterson & Sheridan, LLP (57) ABSTRACT

The present invention generally comprises a showerhead insulator for electrically isolating a showerhead assembly from a processing chamber wall, a chamber liner assembly for lining a processing chamber, a lower chamber liner for lining an evacuation area of a processing chamber, and a flow equalizer for ensuring a uniform evacuation of a processing chamber. When processing a substrate within an etching chamber, the showerhead needs to be electrically isolated from ground. A showerhead insulator may insulate the showerhead from ground while also preventing plasma from entering the volume that it occupies. A chamber liner may protect the chamber walls from contamination and reduce chamber cleaning. A flow equalizer will permit processing gases to be evenly pulled into the evacuation channel rather than a disproportionate flow into the evacuation channel. A lower liner can aid in uniformly drawing the vacuum and protecting the chamber walls from contamination.

23 Claims, 6 Drawing Sheets

(56) References Cited

U.S. PATENT DOCUMENTS

| | | |
|---|---|---|
| 7,138,336 B2 | 11/2006 | Lee et al. |
| 2003/0019428 A1 | 1/2003 | Ku et al. |
| 2003/0198754 A1* | 10/2003 | Xi .................... C23C 16/45512 427/576 |
| 2004/0060658 A1* | 4/2004 | Nishimoto ........ H01J 37/32623 156/345.1 |
| 2006/0108069 A1 | 5/2006 | Gernert |
| 2006/0172542 A1 | 8/2006 | Bera et al. |
| 2006/0193102 A1 | 8/2006 | Bera et al. |
| 2007/0023145 A1 | 2/2007 | Bera et al. |
| 2007/0113783 A1* | 5/2007 | Lee ..................... C23C 16/4404 118/715 |
| 2007/0119370 A1* | 5/2007 | Ma .......................... C23C 16/18 118/723 E |
| 2007/0256785 A1 | 11/2007 | Pamarthy et al. |
| 2008/0110567 A1 | 5/2008 | Miller et al. |
| 2008/0110860 A1 | 5/2008 | Miller et al. |
| 2008/0178801 A1* | 7/2008 | Pavloff ............. H01J 37/32477 118/504 |

\* cited by examiner

SHOWERHEAD INSULATOR AND ETCH CHAMBER LINER

CROSS-REFERENCE TO RELATED APPLICATIONS

This application is a continuation of U.S. patent application Ser. No. 12/345,821, filed Dec. 30, 2008, which claims the benefit of U.S. provisional patent application No. 61/020,229, filed Jan. 10, 2008 which are hereby incorporated by reference.

BACKGROUND OF THE INVENTION

1. Field of the Invention

Embodiments of the present invention generally relate to maintaining uniform process conditions in semiconductor processing chambers such as an etching chamber.

2. Description of the Related Art

Integrated circuits have evolved into complex devices that can include millions of components (e.g., transistors, capacitors, resistors, and the like) on a single chip. The evolution of chip designs continually requires faster circuitry and greater circuit density. The demands for greater circuit density necessitate a reduction in the dimensions of the integrated circuit components. The minimal dimensions of features of such devices are commonly referred to in the art as critical dimensions. The critical dimensions generally include the minimal widths of the features, such as lines, columns, openings, spaces between the lines, and the like.

As these critical dimensions shrink, process uniformity across the substrate becomes paramount to maintain high yields. One problem associated with a conventional plasma etch process used in the manufacture of integrated circuits is the non-uniformity of the etch rate across the substrate, which may be due, in part, to a vacuum pump drawing the etching gas toward the exhaust port and away from the substrate. As gases are more easily pumped from areas of the chamber that are closest to the exhaust port (i.e., the periphery of the substrate), the etching gas is pulled toward the exhaust port and away from the substrate, thereby creating a non-uniform etch on the substrate positioned therein. This non-uniformity may significantly affect performance and increase the cost of fabricating integrated circuits.

Therefore, there is a need in the art for an apparatus for uniformly etching material layers during the manufacture of integrated circuits.

SUMMARY OF THE INVENTION

The present invention generally comprises a showerhead insulator for electrically isolating a showerhead assembly from a processing chamber wall, a chamber liner assembly for lining a processing chamber, a lower chamber liner for lining an evacuation area of a processing chamber, and a flow equalizer for ensuring a uniform evacuation of a processing chamber.

In one embodiment, a showerhead insulating ring comprises a ring body having a first surface and a second surface parallel to the first surface and spaced from the first surface by a third surface and a fourth surface, the third surface arranged at a first angle relative to the first and second surfaces, the fourth surface having at least one stepped portion and arranged at a second angle relative to the first surface and a third angle relative to the second surface.

In another embodiment, a chamber liner comprises a body having a flange portion, a slit valve portion, and a ledge portion. The flange portion comprises a first top surface, a first outside surface, a first inside surface, and a first bottom surface, wherein the first inside surface is substantially parallel to the first outside surface, the first bottom surface is substantially parallel to the first top surface, and the first top surface is coupled with the first inside surface by a first slanted surface that is slanted relative to the first top surface, the first inside surface, the first outside surface, and the first bottom surface. The ledge portion comprises a second top surface coupled to the first inside surface of the flange portion, a second outside surface parallel to the first outside surface of the flange portion, a second bottom surface, a second inside surface, a third inside surface, and a third bottom surface, wherein the second inside surface is disposed radially inward of the third inside surface. The slit valve portion comprises a third outside surface, a fourth inside surface, and a fourth bottom surface, wherein the fourth inside surface is coupled to the fourth bottom surface by a second slanted surface, wherein the second slanted surface is slanted relative to the third outside surface, the fourth inside surface, and the fourth bottom surface.

In another embodiment, a liner assembly, comprises a liner body having a flange portion, a slit valve portion, and a ledge portion, wherein the slit valve portion is coupled to the ledge portion and the ledge portion is coupled to the flange portion, wherein the ledge portion comprises: a first top surface coupled to the flange portion, a first outside surface, a first bottom surface, a first inside surface, a second inside surface, and a second bottom surface, wherein the first inside surface is disposed radially inward of the second inside surface; and a ring body coupled with the liner body, the ring body comprising a second top surface, a second outside surface, a third bottom surface, and a third top surface, wherein the second top surface is coupled to the third top surface by a first slanted surface that is slanted relative to the second top surface, the second outside surface, the third bottom surface, and the third top surface, wherein the second outer surface is coupled with the second inside surface and the second top surface is coupled with the first bottom surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally comprise a showerhead insulator for electrically isolating a showerhead assembly from a processing chamber wall, a chamber liner assembly for lining a processing chamber, a lower chamber liner for lining an evacuation area of a processing chamber, and a flow equalizer for ensuring a uniform evacuation of a processing chamber. When processing a substrate within an etching chamber, the showerhead needs to be electrically isolated from ground. A showerhead insulator may insulate the showerhead from ground while also preventing plasma from entering the volume that it occupies. A chamber liner may protect the chamber walls from contamination and reduce chamber cleaning. A flow equalizer will permit processing gases to be evenly pulled into the evacuation channel rather than a disproportionate flow into the evacuation channel. A lower liner can aid in uniformly drawing the vacuum and protecting the chamber walls from contamination.

The invention will be described below in relation to an etching chamber. However, a variety of plasma deposition and etching chambers may benefit from the teachings disclosed herein, and in particular, dielectric etching chambers such as the ENABLER® etch chamber, which may be part of a semiconductor wafer processing system such as the CENTURA® system, the PRODUCER® etch chamber, the eMax® etch chamber, among others, all of which are available from Applied Materials, Inc. of Santa Clara, Calif. It is contemplated that other plasma reactors, including those from other manufacturers, may be adapted to benefit from the invention.

Figure 1A:
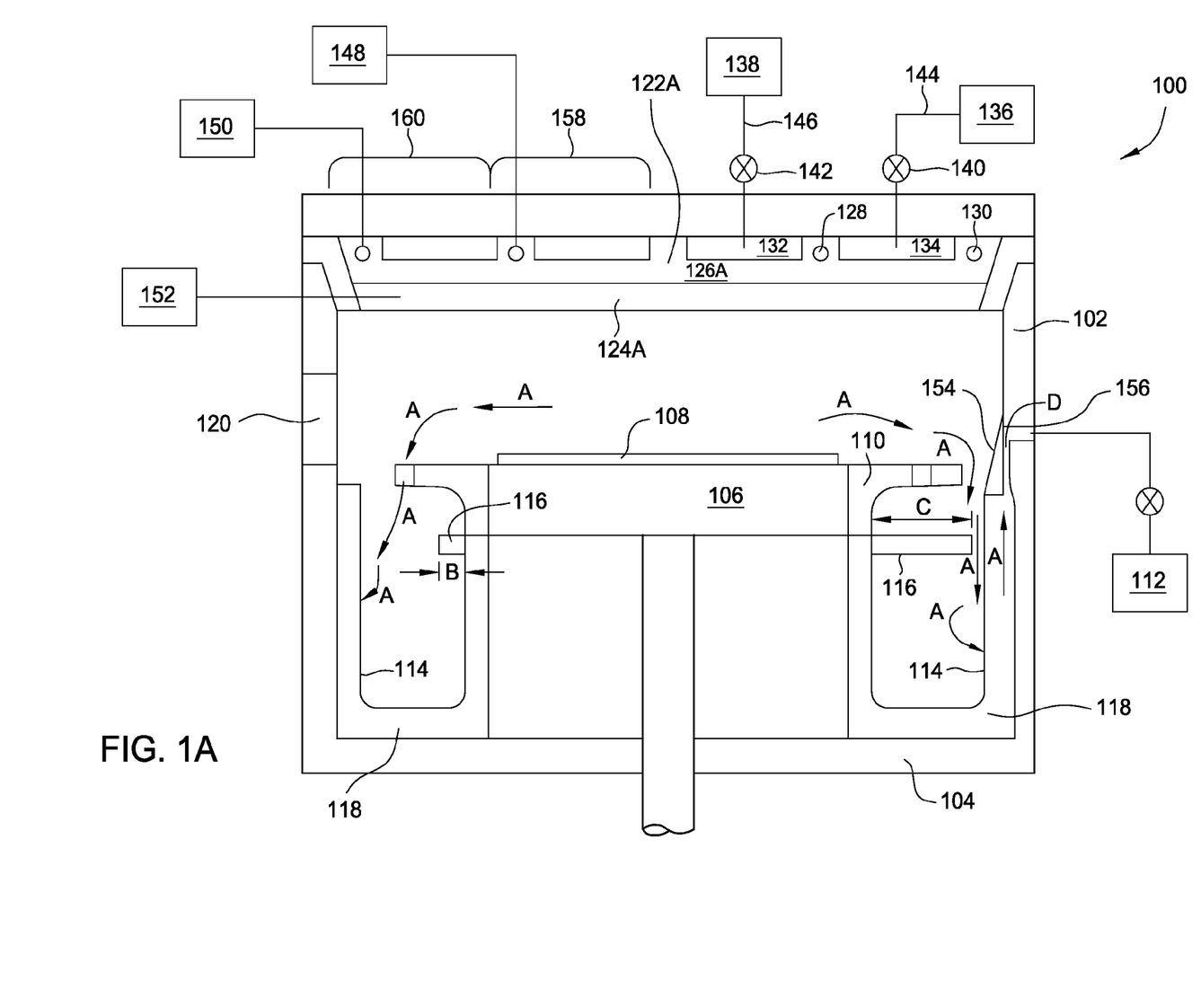
FIG. 1A is a schematic cross sectional view of an etching apparatus according to one embodiment of the invention.
Figure 1B:
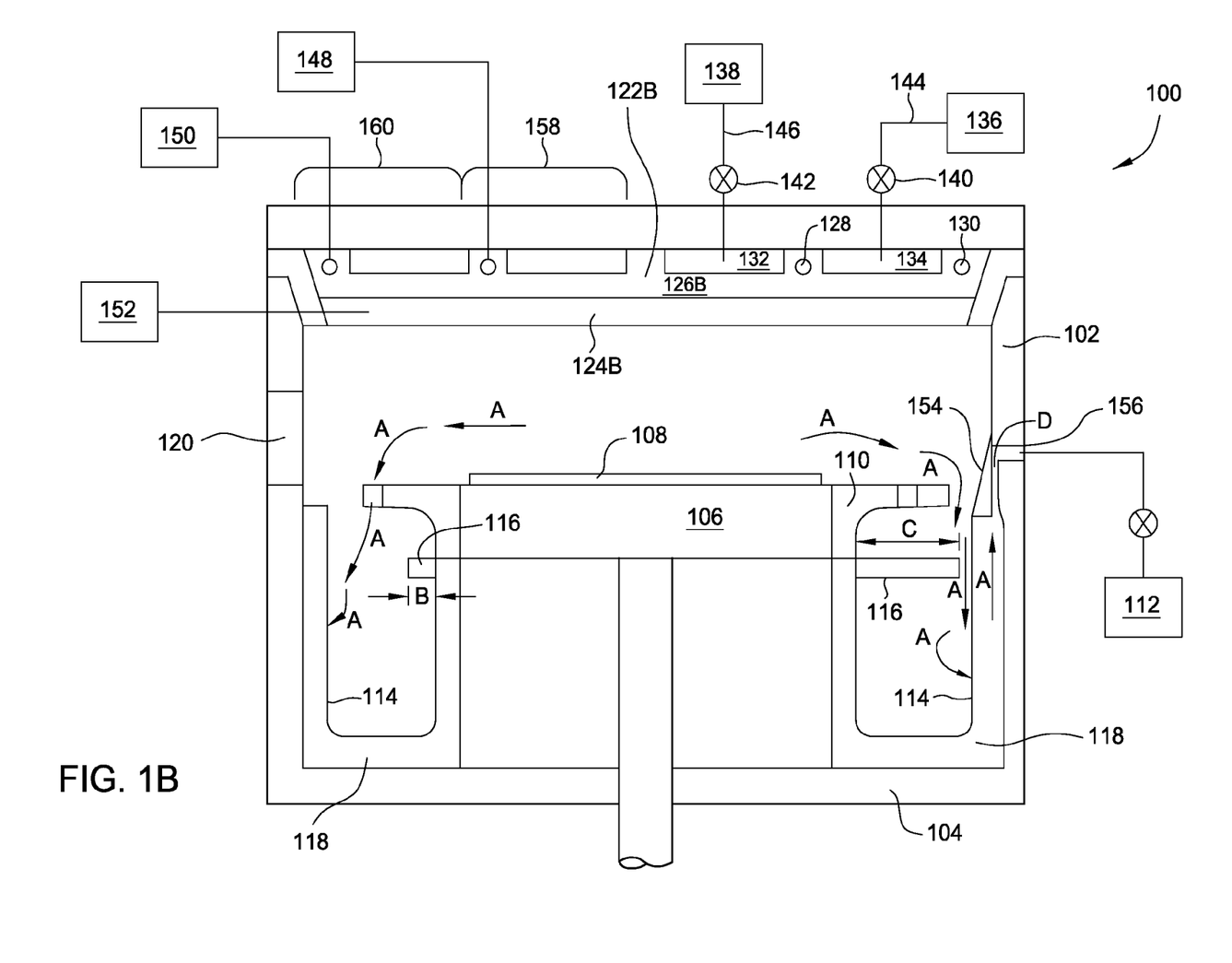
FIG. 1B is a schematic cross sectional view of the etching apparatus of FIG. 1A in which a smaller showerhead assembly is utilized.

FIG. 1A is a schematic cross sectional view of an etching apparatus according to one embodiment of the invention. FIG. 1B is a schematic cross sectional view of the etching apparatus of FIG. 1A in which a smaller showerhead assembly is utilized. The apparatus comprises a chamber 100 having a plurality of walls 102 extending upwards from a chamber bottom 104. Within the chamber 100, a susceptor 106 is present upon which a substrate 108 may be supported for processing. The substrate 108 may be introduced into the chamber 100 through a slit valve opening 120.

The chamber 100 may be evacuated by a vacuum pump 112 coupled to the chamber wall 102 through a vacuum port 156. The chamber 100 may be evacuated by drawing the processing gas around and through a baffle 110 that circumscribes the susceptor 106 and substrate 110. The further away from the vacuum pump 112, the less the draw of the vacuum may be detected. Conversely, the closer to the vacuum pump 112, the greater the draw of the vacuum that may be detected. Thus, to compensate for an uneven vacuum draw, a flow equalizer 116 may be disposed within the chamber 100. The flow equalizer 116 may circumscribe the susceptor 106. The width of the flow equalizer 116 may be smaller at the location further away from the vacuum port 156 as shown by arrows "B" compared to the width of the flow equalizer 116 at a location closest to the vacuum port 156 as shown by arrows "C". The gas being evacuated may flow around the flow equalizer and then through a lower liner 114. The lower liner 114 may have one or more holes therethrough to permit the processing gas to be evacuated therethrough. A space 118 is present between the lower liner 114 and the walls 102 of the chamber 100 to permit the gas to flow behind the lower liner 114 to the vacuum port 156. The vacuum port 156 may be blocked by a flow blocker 154 to prevent processing gas from being drawn directly into the vacuum pump 112 from an area close to the substrate 108. The evacuated gas may flow along a path shown by arrows "A".

Processing gas may be introduced into the processing chamber 100 through a showerhead 122A, 122B. The showerhead 122A, 122B may be biased by an RF current from an RF power source 152, and the showerhead 122A, 122B may comprise a first diffuser plate 126A, 126B and a second diffuser plate 124A, 124B. In one embodiment, the first diffuser plate 126A, 126B may comprise aluminum. In another embodiment, the second diffuser plate 124A, 124B may comprise silicon carbide. The first diffuser plate 126A, 126B and the second diffuser plate 124A, 124B may be bonded together. In one embodiment, the first diffuser plate 126A, 126B and the second diffuser plate 124A, 124B may be welded together. In another embodiment, the first diffuser plate 126A, 126B and the second diffuser plate 124A, 124B may be bonded together utilizing an elastomer adhesive. The showerhead 122A, 122B may be divided into an inner zone 158 and an outer zone 160. The inner zone 158 may have a heating element 128. In one embodiment, the heating element 128 may have an annular shape. The heating element 128 may be coupled with a heating source 148. The outer zone 160 may also comprise a heating element 130 coupled with a heating source 150. In one embodiment, the heating elements 128, 130 may comprise annular conduits that are filled with a heating fluid from the heating sources 148, 150. In another embodiment, the heating elements 128, 130 may comprise heating coils powered by the heating sources 148, 150. While not shown, thermocouples may provide real time temperature feedback to a controller that controls the amount of heat supplied to the inner zone 158 and the outer zone 160.

The inner zone 158 may be coupled with a gas source 138 by a conduit 146. Gas from the gas source 138 may flow through the conduit 146 to a plenum 132 disposed behind the first diffuser plate 126A, 126B of the showerhead 122A, 122B. A valve 142 may be disposed along the conduit 146 to control the amount of gas that flows from the gas source 138 to the plenum 132. Once the gas enters the plenum 132, the gas may then pass through the diffuser plates 124A, 124B, 126A, 126B. Similarly, the outer zone 160 may be coupled with a gas source 138 by a conduit 144. A valve 140 may be disposed along the conduit 144 to control the amount of gas that flows from the gas source 136 to the plenum 134.

It is to be understood that while separate gas sources 136, 138 have been shown in FIGS. 1A and 1B, a single, common gas source may be utilized. When a single common gas source is utilized, separate conduits 144, 146 may be coupled to the gas source and the valves 140, 142 may control the amount of processing gas that reaches the plenums 132, 134.

Figures 2A, 2B:
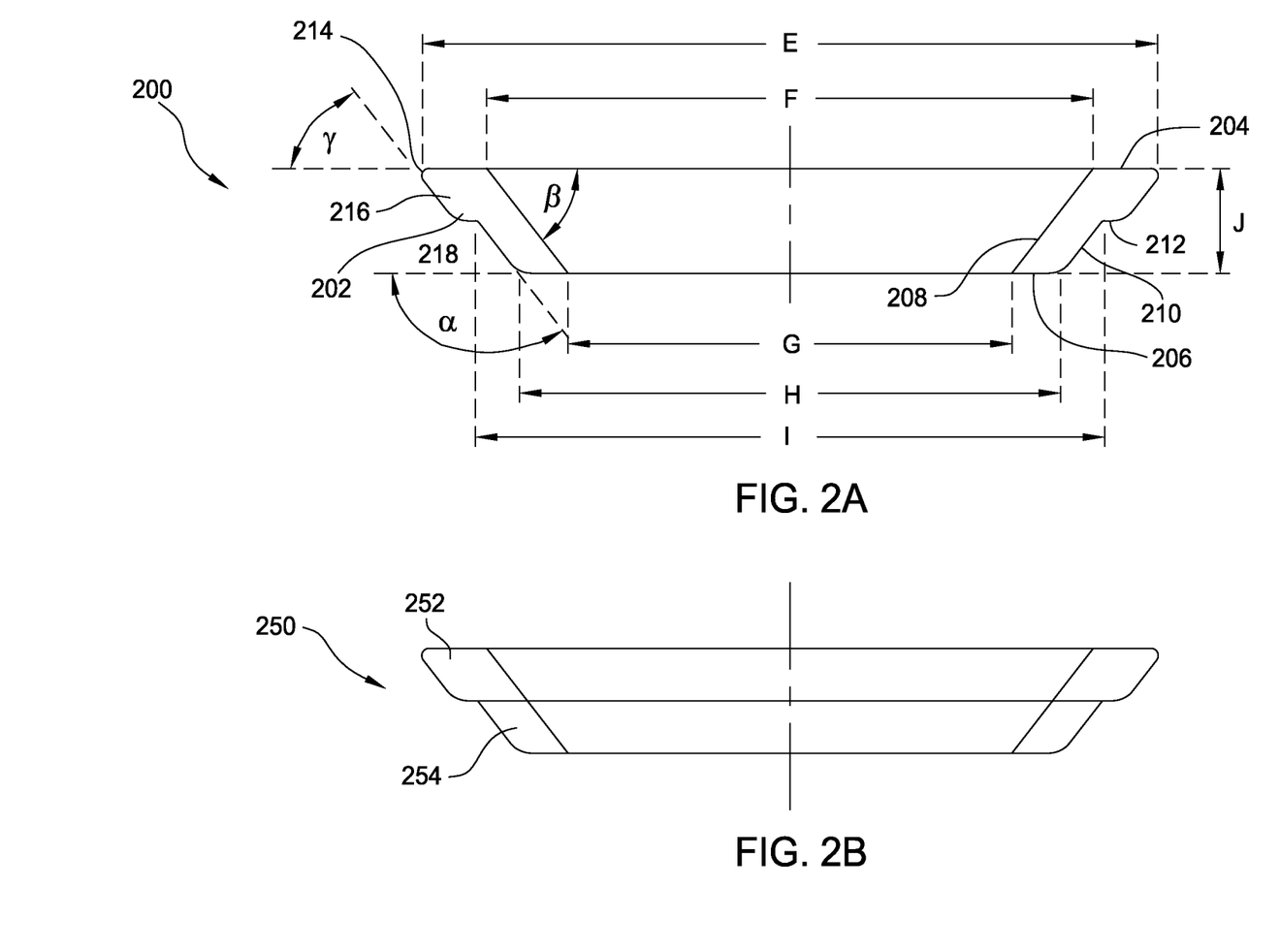
FIG. 2A is a schematic cross sectional view of a showerhead insulating ring according to one embodiment of the invention.
FIG. 2B is a schematic cross sectional view of a showerhead insulating ring according to another embodiment of the invention.

FIG. 2A is a schematic cross sectional view of a showerhead insulating ring 200 according to one embodiment of the invention. The insulating ring 200 performs the function of ensuring the showerhead assembly in the etching apparatus is electrically isolated from ground. Additionally, the insulating ring 200 occupies a space and hence, prevents plasma from occupying the space during the etching operation. The insulating ring 200 comprises a ring body 202 having a top surface 204. In one embodiment, the ring body 202 may comprise quartz. In another embodiment, the ring body 202 may comprise an insulating material.

In one embodiment, the top surface 204 may have a width between about 1 inch and about 2 inches. In another embodiment, the top surface 204 may have a width between about 1.25 inches and about 1.75 inches. In another embodiment, the top surface 204 may have a width between about 1.25 inches and about 1.50 inches. The top surface 204 may have an outer diameter as shown by arrows "E". In one embodiment, the diameter "E" may be between about 18 inches and about 19 inches. In another embodiment, the diameter "E" may be between about 18.25 inches and about 18.75 inches. In another embodiment, the diameter "E" may be between about 18.50 inches and about 18.65 inches.

The top surface 204 may be substantially parallel to a bottom surface 206. In one embodiment, the bottom surface 206 has a width between about 1 inch and about 2 inches. In another embodiment, the bottom surface 206 has a width between about 1 inch and about 1.50 inches. In another embodiment, the bottom surface 206 has a width between about 1 inch and about 1.25 inches. In one embodiment, the top surface 204 has a longer width than the bottom surface 206.

The top surface 204 is coupled with the bottom surface 206 by a slanted inside surface 208. In one embodiment, the slanted inside surface 208 has a length as shown by arrows "J" between about 1 inch and about 2 inches. In another embodiment, the slanted inside surface 208 has a length "J" between about 1.25 inches and about 1.50 inches. In another embodiment, the slanted inside surface 208 has a length "J" between about 1.35 inches and about 1.45 inches.

The slanted inside surface 208, at the end that is coupled to the top surface 204, may have a greater diameter than the end that is coupled to the bottom surface 206. In one embodiment, the diameter of the ring body 202 at the top of the slanted inside surface 208 is between about 17 inches and about 18 inches as shown by arrows "F". In another embodiment, the diameter "F" may be between about 17.25 inches and about 17.75 inches. In another embodiment, the diameter "F" may be between about 17.25 inches and about 17.50 inches. In one embodiment, the slanted inside surface 208 is coupled to the top surface 204 as a rounded corner 214.

The diameter of the slanted inside surface 208 and the end coupled to the bottom surface 206, on the other hand, may have a smaller diameter as shown by arrows "G". In one embodiment, the diameter "G" may be between about 16 inches and about 17 inches. In another embodiment, the diameter "G" may be between about 16.25 inches and about 16.75 inches. In another embodiment, the diameter "G" may be between about 16.50 inches and about 16.60 inches.

The slanted inside surface 208 may be slanted at an angle relative to the top surface 204 as shown by angle "β". In one embodiment, the angle "β" may be between about 75 degrees and about 80 degrees. In another embodiment, the angle "β" may be between about 72 degrees and about 76 degrees. In another embodiment, the angle "β" may be between about 73 degrees and about 76 degrees.

The top surface 204 is also coupled to the bottom surface 206 by a stepped, outer surface 210. The outer surface 210 may have a top portion 216 and a bottom portion 218. The bottom portion 218 may be coupled to the bottom surface 206. The bottom portion 218 may be slanted relative to the bottom surface 206 at an angle "α". In one embodiment, the angle "α" may be between about 100 degrees and about 110 degrees. In another embodiment, the angle "α" may be between about 103 degrees and about 107 degrees. In another embodiment, the angle "α" may be between about 104 degrees and about 105 degrees. The diameter of the ring body 202 at the location where the bottom portion 218 is coupled to the bottom surface 206 may have a diameter as shown by arrows "H". In one embodiment, the diameter "H" may be between about 17.50 inches and about 18.50 inches. In another embodiment, the diameter "H" may be between about 17.50 inches and about 18 inches. In another embodiment, the diameter "H" may be between about 17.55 inches and about 17.75 inches. The top of the bottom portion 218 may also have a diameter as shown by arrows "I". In one embodiment, the diameter "I" may be between about 17.50 inches and about 18.50 inches. In another embodiment, the diameter "I" may be between about 17.75 inches and about 18.25 inches. In another embodiment, the diameter "I" may be between about 18.0 inches and about 18.10 inches.

The bottom portion 218 may be coupled to the top portion 216 by a step 212. In one embodiment, the step 212 may have a width between about 0.25 inches and about 1 inch. In another embodiment, the step 212 may have a width between about 0.25 inches and about 0.75 inches. In another embodiment, the step 212 may have a width between about 0.50 inches and about 0.60 inches. The step 212 may be parallel to both the top surface 204 and the bottom surface 206.

The top portion 216, on the other hand, may be coupled to the top surface 204 at a corner 214. The top portion 216 may slanted relative to the top surface 204 at an angle "γ". In one embodiment, the angle "γ" may be between about 65 degrees and about 85 degrees. In another embodiment, the angle "γ" may be between about 75 degrees and about 85 degrees. In another embodiment, the angle "γ" may be between about 76 degrees and about 81 degrees. The angle "γ" of the top portion 216 may be different than the angle "α" of the bottom portion 218.

FIG. 2B is a schematic cross sectional view of a showerhead insulating ring 250 according to another embodiment of the invention. The ring 250, instead of being a unitary piece of material, may comprise two separate pieces of material. The ring 250 may comprise a top body 252 as well as a bottom body 254. The top body 252 is coupled to the bottom body 254 at the step.

Figure 3A:
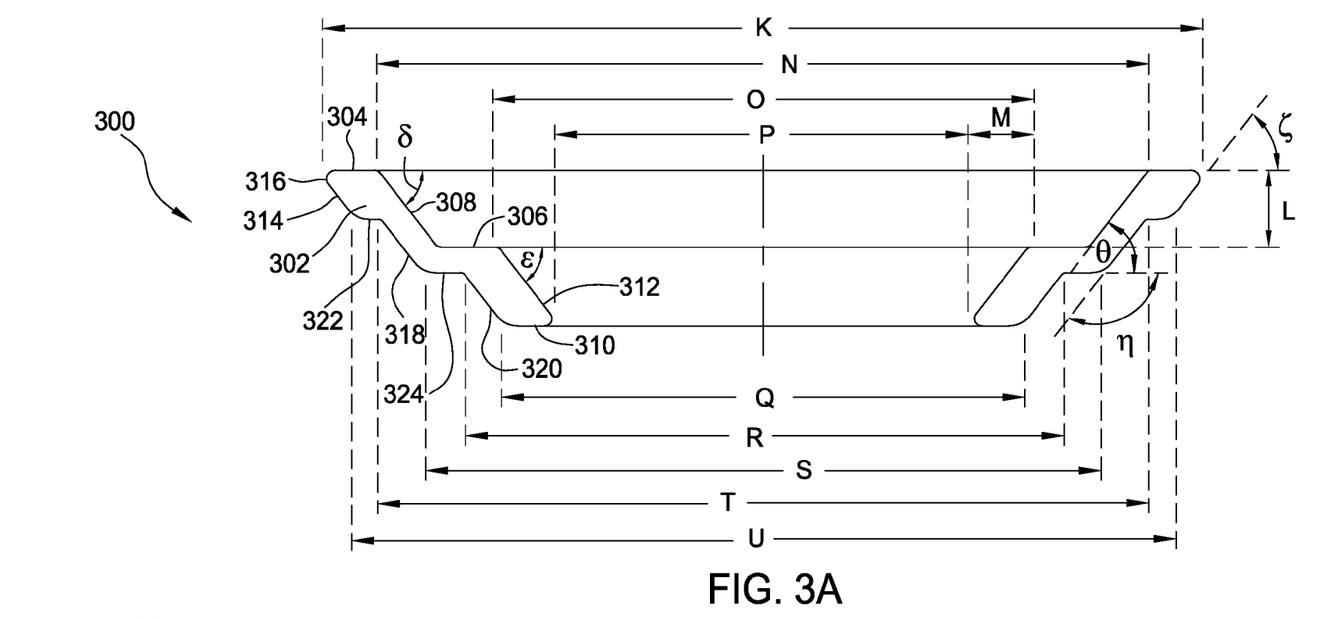
FIG. 3A is a schematic cross sectional view of a showerhead insulating ring according to another embodiment of the invention.

For smaller showerhead assemblies, the insulating ring needs to be shaped to accommodate the smaller showerhead assemblies within the same apparatus as the larger showerhead assemblies. FIG. 3A is a schematic cross sectional view of a showerhead insulating ring 300 according to another embodiment of the invention. The ring 300 may comprise a ring body 302. The ring body 302 has a top surface 304 coupled to a ledge 306 by a first slanted inside surface 308. The top surface 304 may have a width between about 1 inch and about 2 inches. In another embodiment, the top surface 304 may have a width between about 1.25 inches and about 1.75 inches. In another embodiment, the top surface 304 may have a width between about 1.25 inches and about 1.50 inches. The top surface 304 may have an outer diameter as shown by arrows "K". In one embodiment, the diameter "K" may be between about 18 inches and about 19 inches. In another embodiment, the diameter "K" may be between about 18.25 inches and about 18.75 inches. In another embodiment, the diameter "K" may be between about 18.50 inches and about 18.65 inches.

The top surface 304 is coupled with the ledge 306 by a first slanted inside surface 308. In one embodiment, the first slanted inside surface 308 has a length as shown by arrows "L" between about 0.50 inches and about 1 inch. In another embodiment, the first slanted inside surface 308 has a length between about 0.60 inches and about 0.90 inches. In another embodiment, the first slanted inside surface 308 has a length "L" between about 0.75 inches and about 0.90 inches. The first slanted surface 308 may be slanted at an angle "δ" relative to the top surface 304. In one embodiment, the angle "δ" may be between about 75 degrees and about 80 degrees. In another embodiment, the angle "δ" may be between about 72 degrees and about 76 degrees. In another embodiment, the angle "δ" may be between about 73 degrees and about 76 degrees.

The ledge 306 may have a width a shown by arrows "M". One of the diffuser plates of the showerhead assembly may rest on the ledge 306 within the apparatus. In one embodiment, the width "M" may be between about 2 inches and about 3 inches. In another embodiment, the width "M" may be between about 2.25 inches and about 2.75 inches. In another embodiment, the width "M" may be between about 2.50 inches and about 2.70 inches.

The ledge 306 may be coupled to the bottom surface 310 a second slanted inside surface 312. In one embodiment, the second slanted surface 312 may have a height between about 0.50 inches and about 0.70 inches. In another embodiment, the second slanted surface 312 may have a height between about 0.55 inches and about 0.65 inches. In another embodiment, the second slanted surface 312 may have a height between about 0.55 inches and about 0.60 inches. The second slanted surface 312 may be slanted at an angle "ε" relative to the ledge 306. In one embodiment, the angle "ε" may be between about 75 degrees and about 80 degrees. In another embodiment, the angle "ε" may be between about 72 degrees and about 76 degrees. In another embodiment, the angle "ε" may be between about 73 degrees and about 76 degrees.

The bottom surface 310 may be parallel to both the ledge 306 as well as the top surface 304. In one embodiment, the bottom surface 310 may have a length between about 0.50 inches and about 1.50 inches. In another embodiment, the length may be between about 0.75 inches and about 1.25 inches. In another embodiment, the length may be between about 0.90 inches and about 1.10 inches.

The top surface 304 may be coupled to the bottom surface 310 by an outside surface 314. The outside surface 314 may comprise a first slanted outside portion 316, coupled to a second slanted outside portion 318, which is coupled to a third slanted outside portion 320. The first slanted outside portion 316 may be coupled with the top surface 304. In one embodiment, the first slanted outside portion 316 has a height between about 0.50 inches to about 1.00 inches. In another embodiment, the height may be between about 0.60 inches and about 0.75 inches. In another embodiment, the height may be between about 060 inches and about 0.70 inches. The first slanted outside portion 316 may be angled relative to the top surface 304. In one embodiment, the angle "ζ" may be between about 60 degrees and about 85 degrees. In another embodiment, the angle "ζ" may be between about 70 degrees and about 85 degrees. In another embodiment, the angle "ζ" may be between about 75 degrees and 80 degrees.

The first slanted outside portion 316 may be coupled to the second slanted outside portion 318 by a first outside step 322. The first outside step 322 may be parallel to the top surface 304, the bottom surface 310, and the ledge 306. The second slanted portion 318 may be slanted relative to the first outside step 322. In one embodiment, the angle "η" may be between about 85 degrees to about 120 degrees. In anther embodiment, the angle "η" may be between about 95 degrees and about 110 degrees. In another embodiment, the angle "η" may be between about 100 degrees and about 105 degrees. In one embodiment, the height of the second slanted outside portion 320 may be between about 0.25 inches and about 0.75 inches. In another embodiment, the height may be between about 0.30 inches and about 0.60 inches. In another embodiment, the height may be between about 0.40 inches and about 0.55 inches.

The second slanted outside portion 320 may be coupled to the third slanted outside portion 320 by a second outside step 324. The second outside step 324 may be parallel to the first outside step 322, the bottom surface 310, the top surface 304, and the ledge 306. In one embodiment, the second outside step 324 has a length between about 2 inches and about 3 inches. In another embodiment, the length may be between about 2.25 inches and about 2.75 inches. In another embodiment, the length may be between about 2.40 inches to about 2.60 inches.

The third slanted outside portion 324 is coupled to the bottom surface 310. The third slanted outside portion 324 may be slanted relative to the bottom surface 310. In one embodiment, the angle "θ" of the slant may be between about 50 degrees and about 80 degrees. In another embodiment, the angle "θ" may be between about 60 degrees and about 75 degrees. In another embodiment, the angle may be between about 65 degrees and about 75 degrees.

Figure 3B:
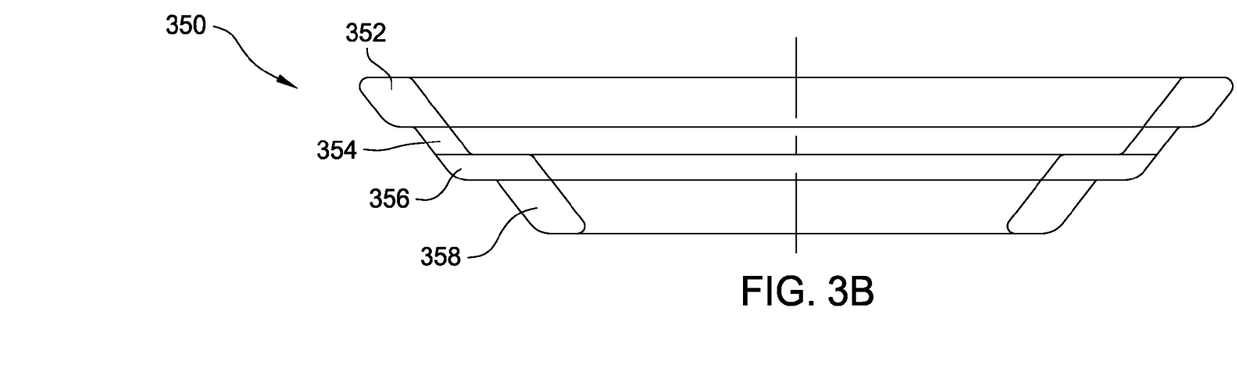
FIG. 3B is a schematic cross sectional view of a showerhead insulating ring according to another embodiment of the invention.

FIG. 3B is a schematic cross sectional view of a showerhead insulating ring 350 according to another embodiment of the invention. The showerhead ring 350 may comprise four different showerhead bodies 352, 354, 356, 358 all coupled together to form the showerhead ring 350.

The processing chamber may be lined to protect the chamber walls from undesired deposition or etching which could lead to substrate contamination. By lining the chamber walls, the chamber walls may be protected from unwanted deposition or etching. The liner may then simply be replaced or cleaned as needed rather than replacing the chamber and/or cleaning the chamber. By replacing the liner, the chamber downtime may be decreased.

Figure 4A:
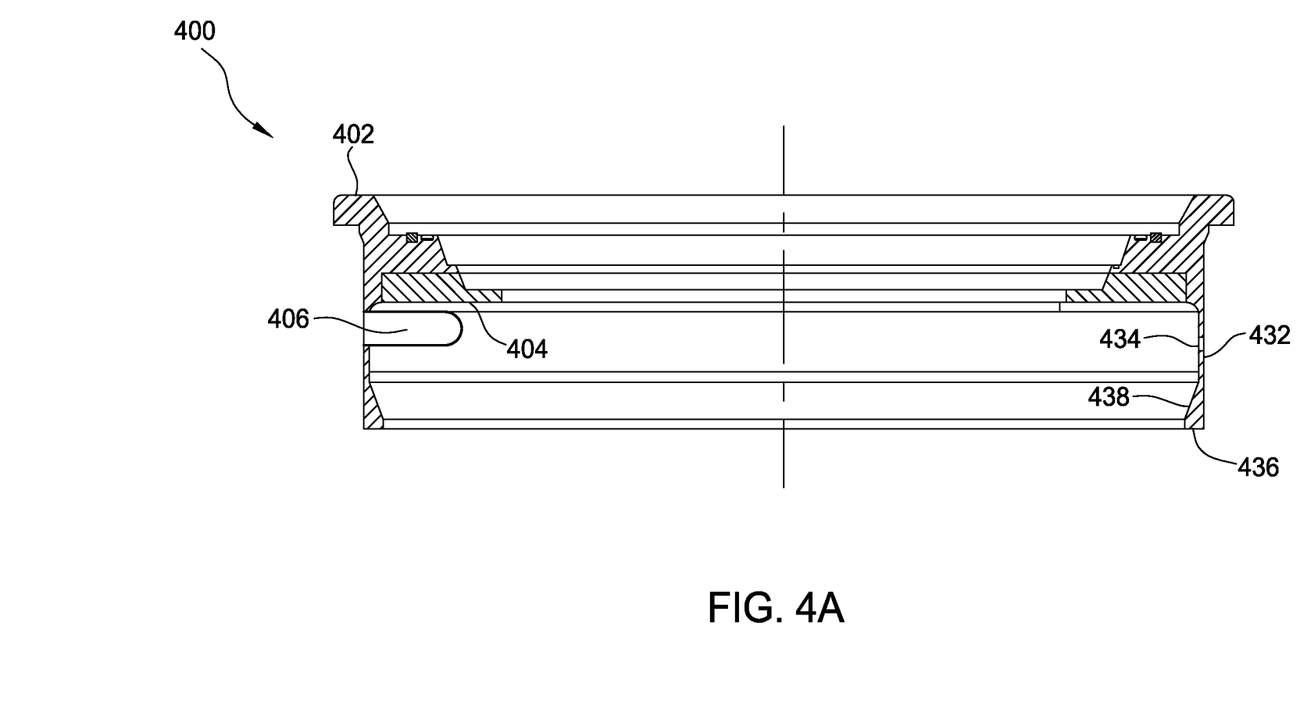
FIG. 4A is a cross sectional view of a chamber liner assembly according to one embodiment of the invention.
Figure 4B:
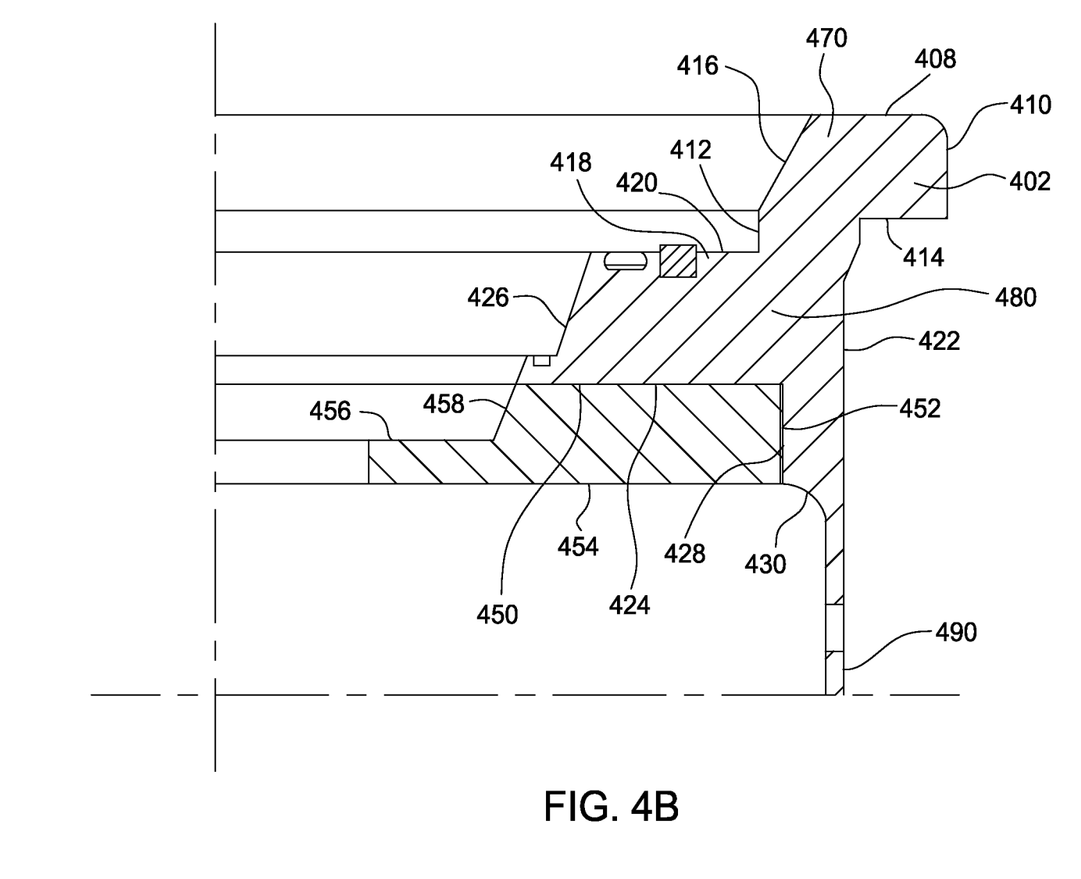
FIG. 4B is a close-up view of a portion of FIG. 4A.

FIG. 4A is a cross sectional view of a chamber liner assembly according to one embodiment of the invention. FIG. 4B is a close-up view of a portion of FIG. 4A. The chamber liner assembly 400 comprises a liner portion 402 and a ring portion 404. A slit valve opening 406 may be bored through the lower portion of the liner portion 402. In one embodiment, the assembly 400 may have a width between about 21 inches and about 23 inches. In another embodiment, the width may be between about 21.5 inches and about 22.5 inches. In another embodiment, the width may be between about 21.75 inches and about 22.25 inches. In one embodiment, the assembly may have a height between about 4.5 inches and about 6 inches. In another embodiment, the height may be between about 5.0 inches and about 5.75 inches. In another embodiment, the height may be between about 5.25 inches and about 5.50 inches. In one embodiment, the liner portion 402 may comprise one or more metals. In another embodiment, the liner portion 402 may comprise aluminum.

The liner portion 402 comprises flange portion 470, a ledge portion 480, and a slit valve portion 490. The flange portion 470 comprises a top surface 408 coupled to a first outside surface 410. The top surface 408 may be substantially perpendicular to the first outside surface 410. The first outside surface 410 may be coupled to a first bottom surface 414. The first bottom surface 414 may be substantially parallel to the first top surface 408 and perpendicular to the first outside surface 410. The top surface 408 may also be coupled to a first inside surface 412 by a first slanted inside surface 416. The flange portion 470 may be coupled to the chamber walls when the chamber is assembled.

The ledge portion 480 comprises ledge 418 having a second top surface 420 coupled to the first inside surface of the flange portion 470. The second top surface 420 may be substantially parallel to the top surface 408. The ledge portion 480 may also comprise a second inside surface 426 and a second outside surface 422. The second outside surface 422 may be substantially parallel to the first outside surface 410. The ledge portion 480 may also comprise a second bottom surface 424 coupled to a third bottom surface 430 by a third inside surface 428. The third inside surface 428 may be substantially perpendicular to the second outside surface 422.

The slit valve portion 490 may comprise a third outer surface 432 coupled to a fourth bottom surface 436. The fourth bottom surface 436 may be coupled to a fourth inside surface 434 by a second slanted surface 438. The fourth bottom surface 436 may be substantially parallel to the top surface 408, the first bottom surface 414, and the second bottom surface 424. The third outer surface 432 may be substantially perpendicular to the fourth bottom surface 436.

The liner assembly may also comprise a ring portion 404. In one embodiment, the ring portion 404 may comprise an insulating material. In another embodiment, the ring portion 404 may comprise quartz. In another embodiment, the ring portion 404 may comprise silicon carbide. The ring portion 404 may be coupled to the showerhead insulating assembly when the chamber is assembled. The ring portion 404 may comprise a top surface 450 coupled to an outside surface 452. The top surface 454 may be parallel to the second bottom surface 424 of the liner portion 402 and substantially perpendicular to the outside surface 452. The top surface 454, when the ring portion 404 and the liner portion 402 are coupled together, may be coupled together by a bonding material. Additionally, the outside surface 452 may be substantially parallel to the third inside surface 428 of the ledge portion 480 of the liner portion 402. The outside surface 452, when the assembly 400 is assembled, may be coupled to the third inside surface 428 by a bonding material.

The top surface 450 may be coupled to a bottom surface 454 by the outside surface 452. The bottom surface 454 may be substantially parallel to the top surface 450 and substantially perpendicular to the outside surface 452. A first slanted inside surface 458 may couple to the top surface 450 to a ledge surface 456 of the ring portion 404. The ledge surface 456 may be coupled with the showerhead insulating ring when the chamber is assembled.

The liner portion 402 and the ring portion 404 may comprise separate materials. The ring portion is closer to the processing area of the chamber and thus, has a greater likelihood of being exposed to a plasma. Therefore, the ring portion 404 may be made of an insulating material such as silicon carbide. The liner portion 402, however, is further area from the plasma field and in some embodiments, is not exposed to the plasma field at all. Therefore, the liner portion 402 may be made of a cheaper, easier to manufacture material such as aluminum. However, it should be noted, that liner portion 402 and the ring portion 404 may comprise the same material. In embodiments where the ring portion 404 and the liner portion 402 comprise the same material, the material comprises an insulating material such as silicon carbide.

By properly insulating the showerhead from the chamber body and by lining the chamber body, a uniform plasma may be formed and thus, etching uniformity may be increased.

While the foregoing is directed to embodiments of the present invention, other and further embodiments of the invention may be devised without departing from the basic scope thereof, and the scope thereof is determined by the claims that follow.

The invention claimed is:

1. A chamber liner assembly, comprising:
   a liner body having a flange portion, a slit valve portion, and a ledge portion, wherein the slit valve portion is directly coupled to the ledge portion and the ledge portion is directly coupled to the flange portion, such that the flange portion is above the slit valve portion, wherein the ledge portion comprises: a first top surface coupled to the flange portion, a first outside surface, a first bottom surface, a first inside surface, a second inside surface, and a second bottom surface, wherein the first inside surface is disposed radially inward of the second inside surface; and
   a showerhead insulating ring body directly coupled with the liner body, the ring body comprising a second top surface, a second outside surface, a third bottom surface, and a third top surface, wherein the second top surface is coupled to the third top surface by a first slanted surface that is slanted relative to the second top surface, the second outside surface, the third bottom surface, and the third top surface, wherein the second outside surface is coupled with the second inside surface and the second top surface is coupled with the first bottom surface and wherein the first slanted surface extends from the first bottom surface, wherein the liner body extends both above and below the ring body, the second top surface and the second outside surface coupled by a bonding material to the first bottom surface and the second inside surface of the ledge portion of the liner body, respectively.

2. The assembly of claim 1, wherein the liner body and the ring body comprise different material.

3. The assembly of claim 1, wherein the ring body comprises silicon carbide.

4. The assembly of claim 1, wherein the flange portion comprises a fourth top surface, a third outside surface, a third inside surface, and a fourth bottom surface, wherein the third inside surface is substantially parallel to the third outside surface, the fourth bottom surface is substantially parallel to the fourth top surface, and the fourth top surface is coupled with the third inside surface by a second slanted surface that is slanted relative to the fourth top surface, the third inside surface, the third outside surface, and the fourth bottom surface.

5. The assembly of claim 1, wherein the slit valve portion comprises a fourth outside surface, a fourth inside surface, and a fifth bottom surface, wherein the fourth inside surface is coupled to the fifth bottom surface by a third slanted surface, wherein the third slanted surface is slanted relative to the fourth outside surface, the fourth inside surface, and the fifth bottom surface.

6. The assembly of claim 1, wherein the slit valve portion has a slit valve opening carved therethrough.

7. The assembly of claim 2, wherein the ring body comprises silicon carbide.

8. The assembly of claim 7, wherein the flange portion comprises a fourth top surface, a third outside surface, a third inside surface, and a fourth bottom surface, wherein the third inside surface is substantially parallel to the third outside surface, the fourth bottom surface is substantially parallel to the fourth top surface, and the fourth top surface is coupled with the third inside surface by a second slanted surface that is slanted relative to the fourth top surface, the third inside surface, the third outside surface, and the fourth bottom surface.

9. The assembly of claim 8, wherein the slit valve portion comprises a fourth outside surface, a fourth inside surface, and a fifth bottom surface, wherein the fourth inside surface is coupled to the fifth bottom surface by a third slanted surface, wherein the third slanted surface is slanted relative to the fourth outside surface, the fourth inside surface, and the fifth bottom surface.

10. The assembly of claim 9, wherein the slit valve portion has a slit valve opening carved therethrough.

11. The assembly of claim 10, wherein the liner body comprises a metal.

12. The assembly of claim 11, wherein the metal comprises aluminum.

13. The assembly of claim 12, wherein the third outside surface has a diameter between about 21.5 inches and 22.5 inches.

14. The assembly of claim 13, wherein the liner body has a height between about 5 inches and about 5.5 inches.

15. The assembly of claim 4, wherein the slit valve portion comprises a fourth outside surface, a fourth inside surface, and a fifth bottom surface, wherein the fourth inside surface is coupled to the fifth bottom surface by a third slanted surface, wherein the third slanted surface is slanted relative to the fourth outside surface, the fourth inside surface, and the fifth bottom surface.

16. The assembly of claim 15, wherein the third outside surface has a diameter between about 21.5 inches and 22.5 inches.

17. The assembly of claim 16, wherein the liner body has a height between about 5 inches and about 5.5 inches.

18. The assembly of claim 17, wherein the liner body comprises aluminum.

19. The assembly of claim 18, wherein the ring body comprises silicon carbide.

20. The assembly of claim 19, wherein the third outside surface has a diameter between about 21.5 inches and 22.5 inches and wherein the liner body has a height between about 5 inches and about 5.5 inches.

21. The assembly of claim 5, wherein a width of the fifth bottom surface of the slit valve portion is greater than a distance between the fourth inside surface of the slit valve portion and the fourth outside surface of the slit valve portion.

22. The assembly of claim 9, wherein a width of the fifth bottom surface of the slit valve portion is greater than a distance between the fourth inside surface of the slit valve portion and the fourth outside surface of the slit valve portion.

23. The assembly of claim 15, wherein a width of the fifth bottom surface of the slit valve portion is greater than a distance between the fourth inside surface of the slit valve portion and the fourth outside surface of the slit valve portion.

* * * * *